(12) United States Patent
Chuang et al.

(10) Patent No.: US 7,986,029 B2
(45) Date of Patent: Jul. 26, 2011

(54) DUAL SOI STRUCTURE

(75) Inventors: Chiang-Ming Chuang, Changhua (TW); Kuang-Hsin Chen, Jung-Li (TW); I-Lu Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/268,914

(22) Filed: Nov. 8, 2005

(65) Prior Publication Data
US 2007/0102769 A1 May 10, 2007

(51) Int. Cl.
*H01L 29/06* (2006.01)
(52) U.S. Cl. ........ 257/618; 438/618; 438/187; 438/259; 438/311; 438/318; 257/E21.561; 257/E27.112; 257/368; 257/369
(58) Field of Classification Search .................. 257/618
See application file for complete search history.

(56) References Cited

U.S. PATENT DOCUMENTS

| | | | | |
|---|---|---|---|---|
| 4,478,655 A * | 10/1984 | Nagakubo et al. | ........... | 438/151 |
| 4,774,196 A * | 9/1988 | Blanchard | ........... | 438/455 |
| 5,627,395 A * | 5/1997 | Witek et al. | ........... | 257/350 |
| 5,801,080 A * | 9/1998 | Inoue et al. | ........... | 438/405 |
| 5,929,486 A * | 7/1999 | Kitakado | ........... | 257/345 |
| 5,994,154 A * | 11/1999 | Morikawa | ........... | 438/24 |
| 6,225,646 B1 * | 5/2001 | Gardner et al. | ........... | 257/59 |
| 6,509,615 B2 * | 1/2003 | Iwata et al. | ........... | 257/368 |
| 6,624,476 B1 * | 9/2003 | Chan et al. | ........... | 257/347 |
| 6,635,543 B2 * | 10/2003 | Furukawa et al. | ........... | 438/311 |
| 6,724,019 B2 * | 4/2004 | Oda et al. | ........... | 257/195 |
| 6,724,045 B1 * | 4/2004 | Ushiku | ........... | 257/347 |
| 6,756,278 B2 * | 6/2004 | Yuki et al. | ........... | 438/309 |
| 6,764,917 B1 * | 7/2004 | Chan et al. | ........... | 438/406 |
| 6,815,278 B1 * | 11/2004 | Ieong et al. | ........... | 438/198 |
| 6,830,962 B1 * | 12/2004 | Guarini et al. | ........... | 438/149 |
| 7,033,874 B2 * | 4/2006 | Itonaga et al. | ........... | 438/197 |
| 7,034,362 B2 * | 4/2006 | Rim | ........... | 257/351 |
| 7,102,204 B2 * | 9/2006 | Berndlmaier et al. | ........ | 257/532 |
| 7,205,210 B2 * | 4/2007 | Barr et al. | ........... | 438/455 |
| 7,208,815 B2 * | 4/2007 | Chen et al. | ........... | 257/627 |
| 7,226,833 B2 * | 6/2007 | White et al. | ........... | 438/222 |
| 7,229,877 B2 * | 6/2007 | Cheng et al. | ........... | 438/241 |

(Continued)

OTHER PUBLICATIONS

Pae, S., et al., "Multiple Layers of Silicon-On-Insulator (MLSOI) Islands Fabrication Process and Fully-Depleted SOI pMOSFETs," Proceedings 1998 IEEE International SOI Conference (Oct. 1998) pp. 15-16.

(Continued)

*Primary Examiner* — N Drew Richards
*Assistant Examiner* — Ankush k Singal
(74) *Attorney, Agent, or Firm* — Slater & Matsil, L.L.P.

(57) ABSTRACT

A semiconductor structure having a hybrid crystal orientation is provided. The semiconductor structure includes an insulator layer, e.g., a buried oxide (BOX), on a first semiconductor layer, and a second semiconductor layer on the buried oxide, wherein the first and second semiconductor layers have a first and a second crystal orientation, respectively. A first region of the second semiconductor layer is replaced with an epitaxially grown layer of the first semiconductor layer, thereby providing a substrate having a first region with a first crystal orientation and a second region with a second crystal orientation. An isolation structure is formed to isolate the first and second regions. Thereafter, NMOS and PMOS transistors may be formed on the substrate in the region having the crystal orientation that is the most appropriate.

18 Claims, 5 Drawing Sheets

U.S. PATENT DOCUMENTS

| | | | |
|---|---|---|---|
| 7,268,377 B2* | 9/2007 | Ieong et al. | 257/255 |
| 7,329,923 B2* | 2/2008 | Doris et al. | 257/347 |
| 7,524,707 B2* | 4/2009 | Adetutu et al. | 438/150 |
| 2001/0039091 A1* | 11/2001 | Nakagawa | 438/259 |
| 2003/0119245 A1* | 6/2003 | Iwamatsu et al. | 438/207 |
| 2005/0082531 A1* | 4/2005 | Rim | 257/72 |
| 2005/0093104 A1* | 5/2005 | Ieong et al. | 257/627 |
| 2005/0116290 A1* | 6/2005 | de Souza et al. | 257/347 |
| 2005/0224875 A1 | 10/2005 | Anderson et al. | |
| 2005/0239241 A1* | 10/2005 | Ouyang et al. | 438/197 |
| 2006/0046409 A1* | 3/2006 | Fujimaki | 438/309 |
| 2006/0049460 A1* | 3/2006 | Chen et al. | 257/347 |
| 2006/0094169 A1* | 5/2006 | White et al. | 438/149 |
| 2006/0157783 A1* | 7/2006 | Chen et al. | 257/347 |
| 2006/0292770 A1* | 12/2006 | Wu et al. | 438/187 |
| 2007/0120218 A1* | 5/2007 | Hsu et al. | 257/529 |
| 2007/0176236 A1* | 8/2007 | Oka et al. | 257/347 |
| 2007/0218654 A1* | 9/2007 | Spencer et al. | 438/478 |
| 2007/0235807 A1* | 10/2007 | White et al. | 257/351 |

OTHER PUBLICATIONS

Subramanian, C.K., et al., "SOI Processing by Epitaxial Lateral Overgrowth," IEEE (1991) pp. 132-133.

Yang, M., et al., "On the Integration of CMOS with Hybrid Crystal Orientations," Symposium on VLSI Technology Digest of Technical Papers (2004) pp. 160-161.

* cited by examiner

DUAL SOI STRUCTURE

TECHNICAL FIELD

The present invention relates generally to semiconductor devices and, more particularly, to a semiconductor substrate having a hybrid crystal orientation.

BACKGROUND

In present semiconductor technology, complementary metal oxide semiconductor (CMOS) devices, such as N-type field effect transistors (NFETs) and P-type FETs (PFETs), are typically fabricated on semiconductor wafers, such as silicon wafers that have a single crystal orientation, sometimes referred to as direction. In particular, most of today's semiconductor devices are built on silicon substrates having a (100) crystal orientation.

While substrates having a (100) Si crystal orientation are preferred for NFETs due to their greater electron mobility, substrates having a (110) Si crystal orientation are preferred for PFETs due to their greater hole mobility. Typically, hole mobility values on a substrate having a (100) Si crystal orientation are roughly about 2-4 times lower than the corresponding electron mobility for the same crystal orientation. To compensate for this discrepancy, PFETs are typically designed with greater widths in order to balance pull-up currents against the NFET pull-down currents and achieve uniform circuit switching. PFETs having greater widths, however, are undesirable because they occupy a greater amount of chip area. On the other hand, hole mobilities on a substrate having a (110) Si crystal orientation are about two times higher than on a substrate having a (100) Si crystal orientation. Therefore, PFETs formed on a (110) surface will exhibit significantly higher drive currents than PFETs formed on a (100) surface. Unfortunately, electron mobilities on (110) Si surfaces are significantly degraded compared to (100) Si surfaces.

As can be deduced from the above, the (110) Si surface is optimal for PFET devices because of excellent hole mobility, yet such a crystal orientation is inappropriate for NFET devices. Instead, the (100) Si surface is optimal for NFET. Similarly, the (100) Si surface is optimal for NFET devices because of greater electron mobility, yet such a crystal orientation is inappropriate for PFET devices. What is needed, therefore, is hybrid substrates having different crystal orientations.

SUMMARY OF THE INVENTION

These and other problems are generally reduced, solved or circumvented, and technical advantages are generally achieved, by embodiments of the present invention, which provides a semiconductor structure having a hybrid crystal orientation.

In an embodiment, a semiconductor structure having a hybrid crystal orientation is provided. The semiconductor structure includes a first semiconductor layer and a second semiconductor layer on an insulator layer, e.g., a buried oxide (BOX), wherein the first semiconductor layer and the second semiconductor layer have different crystal orientations. A third semiconductor layer underlies the insulator layer and is isolated from the first semiconductor layer and the second semiconductor layer. An isolation structure may isolate the first semiconductor layer from the second semiconductor layer.

In an embodiment, the first semiconductor layer has a (100) crystal orientation, which is preferred to enhance the electron mobility of NMOS devices, and the second semiconductor layer has a (110) crystal orientation, which is preferred to enhance the hole mobility of PMOS devices.

In a preferred embodiment, a method of forming a semiconductor structure having a first region with a first crystal orientation and a second region with a second crystal orientation is provided. The method includes providing a wafer having a first semiconductor layer, a second semiconductor layer, and an insulator layer between the first semiconductor layer and the second semiconductor layer, wherein the first semiconductor layer and the second semiconductor layer have different crystal orientations. A portion of the first semiconductor layer is removed to expose a portion of the insulator layer, and a portion of the exposed insulator layer is removed to expose a portion of the second semiconductor layer. An epitaxial layer is grown from the exposed portion of the second semiconductor layer such that the epitaxial layer extends over the exposed portion of the exposed insulator layer. The region in which the epitaxial layer contacts the second semiconductor layer is removed and an insulating material is formed to isolate the epitaxial layer over the insulator layer from the second semiconductor layer. Other isolation structures may be used to isolate the epitaxial layer from the first semiconductor layer.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1-12 illustrate an embodiment of forming a hybrid semiconductor structure having a hybrid crystal orientation. Embodiments of the present invention may be used in a variety of circuits. For example, embodiments of the present invention may be useful in I/O devices, core devices, memory circuits, system-on-chip (SoC) devices, other integrated circuits, and the like, wherein NMOS and PMOS devices are to be used and it is desirable to use differing crystal orientations to customize the operating characteristics of the NMOS and PMOS devices. It should be noted that the embodiment described below utilizes two different crystal orientations for illustrative purposes only. Embodiments of the present invention may be utilized to form hybrid semiconductor structures having three or more crystal orientations. Furthermore, while the preferred embodiment uses (100) and (110) crystal orientations, other orientations may be used.

Figure 1:
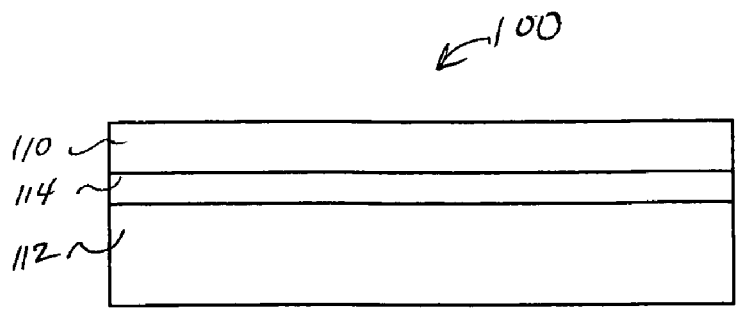
FIGS. 1-12 illustrate cross-sectional views of a wafer after various process steps are performed in accordance with one embodiment of the present invention.

FIG. 1 illustrates a wafer 100 having a first semiconductor layer 110 and a second semiconductor layer 112 separated by a first insulator layer 114 in accordance with an embodiment of the present invention. The first and second semiconductor layers 110 and 112 preferably have different crystal orientations. For example, one of the first semiconductor layer 110 and the second semiconductor layer 112 may have a (100) crystal orientation, and the other semiconductor layer may have a (110) crystal orientation. In this embodiment, it has been found that NMOS transistors oriented such that the source-to-drain direction is parallel to the (100) crystal orientation enhance electron mobility, and that PMOS transistors oriented such that the source-to-drain direction is parallel to the (110) crystal orientation enhance hole mobility.

The wafer 100 may be formed by bonding two substrates, a first substrate comprising the first semiconductor layer 110 of a first crystal orientation and a second substrate comprising the second semiconductor layer 112 of a second crystal orientation. The first substrate includes the first insulator layer 114 formed on the first semiconductor layer 110. Preferably, the first insulator layer 114 comprises an oxide layer having a thickness between about 5 nm and about 300 nm. The first and second substrates are then bonded with the first insulator layer 114 positioned between the first semiconductor layer 110 and the second semiconductor layer 112. The first semiconductor layer 110 may be thinned, thereby forming the substrate 100 shown in FIG. 1.

Figure 2:
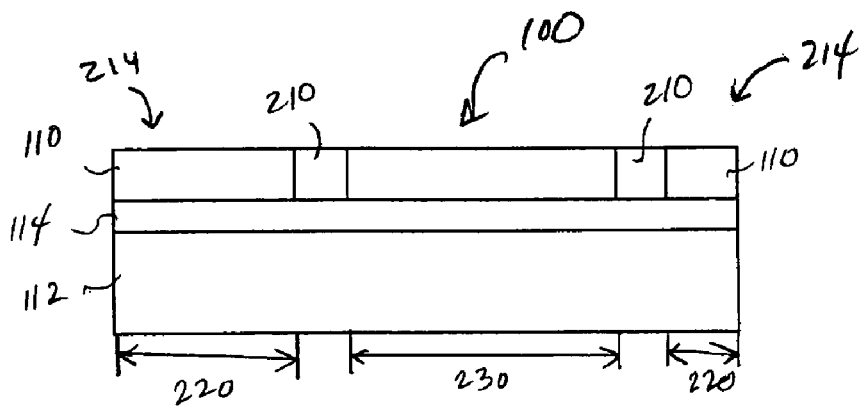

FIG. 2 illustrates the wafer 100 of FIG. 1 after shallow-trench isolations (STIs) 210 have been formed in accordance with an embodiment of the present invention. The STIs 210, or some other isolation structures, isolate active areas on the substrate. In this case, the STIs 210 isolate a second region 230 from other portions of the first semiconductor layer 110, e.g., first regions 220. As will be shown in the following paragraphs, the first regions 220 will have a first crystal orientation and the second region 230 will be altered to have the second crystal orientation of the second semiconductor layer 112. The first semiconductor layer 110 within the first regions 220 form the first active regions 214 having a first crystal orientation.

The STIs 210 may be formed by etching trenches through the first semiconductor layer 110 to the first insulator layer 114 and filling the trenches with a dielectric material, such as silicon dioxide, a high-density plasma (HDP) oxide, or the like. It should be noted that the STIs 210 may be formed through only the first semiconductor layer 110, but it is possible that the STIs 210 be formed through the first semiconductor layer 110 and at least a portion of the first insulator layer 114 to ensure a better isolation.

Figure 3:
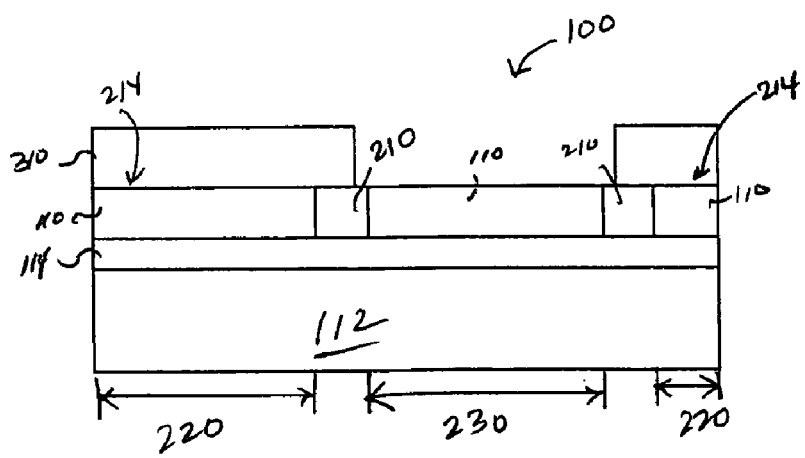

FIG. 3 illustrates the wafer 100 of FIG. 2 after a first mask 310 has been applied and patterned in accordance with an embodiment of the present invention. In an embodiment, the first mask 310 is a hard mask, such as a silicon nitride ($Si_3N_4$) layer, a silicon oxide layer, or the like. In an embodiment, the first mask 310 may be patterned using photolithography techniques known in the art to expose the first semiconductor layer 110 within the second region 230.

The first mask 310 may comprise a plurality of layers. For example, in an embodiment the first mask 310 may comprise an oxide layer (e.g., a silicon dioxide layer) and a nitrogen-containing layer (e.g., a silicon nitride layer). Furthermore, other materials may be used, such as silicon nitride $Si_xN_y$, silicon oxynitride $SiO_xN_y$, silicon oxime $SiO_xN_y:H_z$, other nitrogen-containing materials, other oxides, a combination thereof, or the like.

Figure 4:
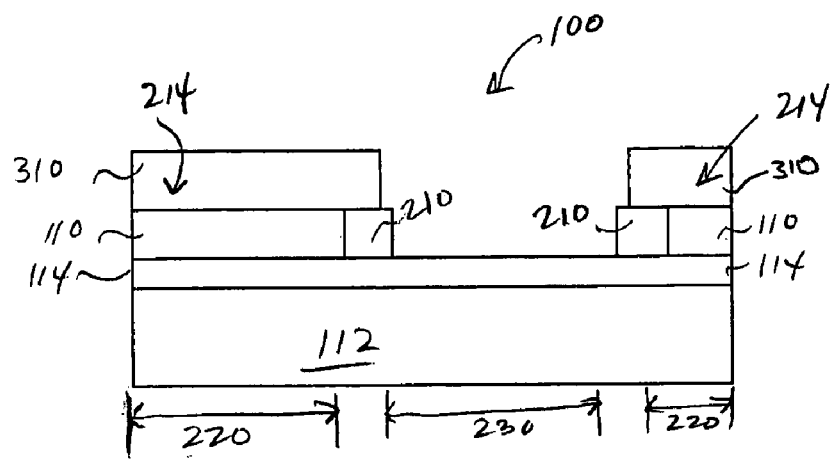

FIG. 4 illustrates the wafer 100 of FIG. 3 after exposed portions of the first semiconductor layer 110 in the second region 230 have been removed in accordance with an embodiment of the present invention. In an embodiment, the first semiconductor layer 110 is removed by an etching process, wherein the etching solution exhibits a high-etch selectivity between the first semiconductor layer 110 and the first insulator layer 114. In this manner, the first insulator layer acts as an etch stop for the etching process to remove the first semiconductor layer 110.

For example, in an embodiment in which the first semiconductor layer 110 comprises silicon and the first insulator layer 114 comprises an oxide, the first semiconductor layer 110 may be removed by performing a dry etch. This etching process removes the exposed portions of the first semiconductor layer 110 in the second region 230 as illustrated in FIG. 4.

Figure 5:
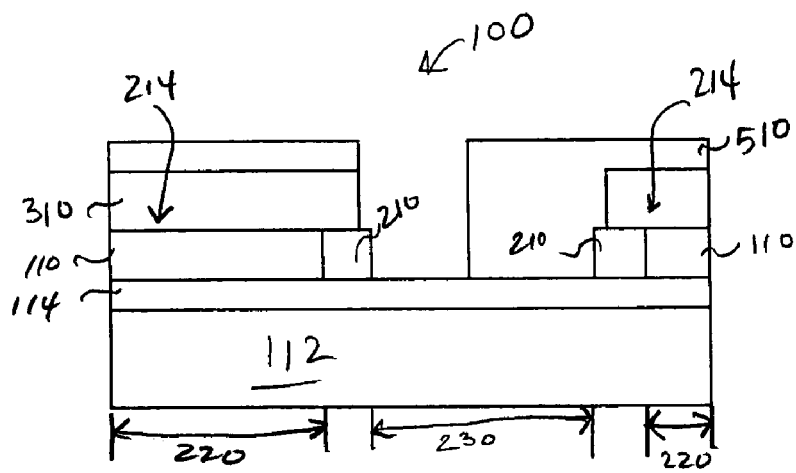

FIG. 5 illustrates the wafer 100 of FIG. 4 after a second mask 510 has been applied and patterned in accordance with an embodiment of the present invention. In an embodiment, the second mask 510 comprises a photoresist material that has been applied, exposed, and developed to expose a portion of the first insulator layer 114. In subsequent steps, the exposed portion of the first insulator layer 114 will be removed to expose the underlying second semiconductor layer 112.

Figure 6:
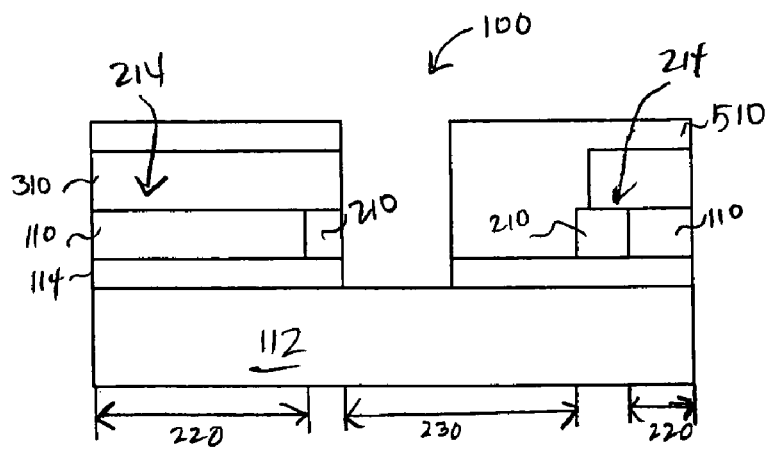
Figure 7:
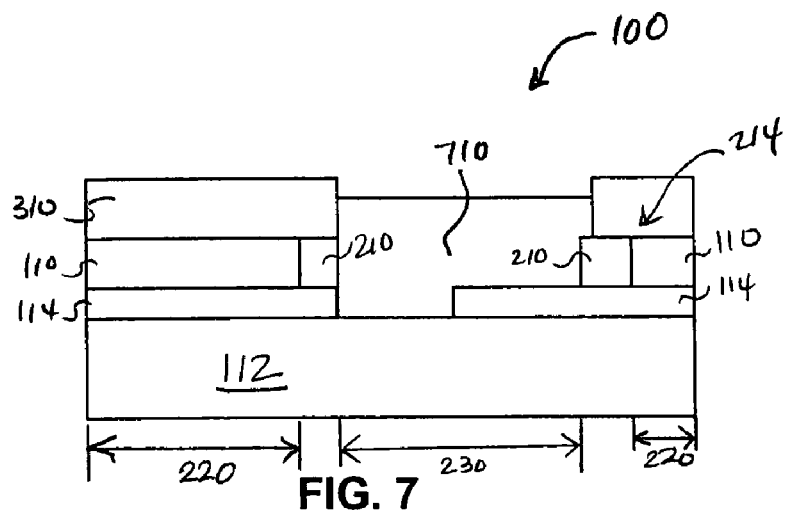

FIG. 6 illustrates the wafer 100 of FIG. 5 after exposed portions of the first insulator layer 114 have been removed and FIG. 7 illustrates the wafer 100 of FIG. 6 after an epitaxial layer 710 has been grown in accordance with an embodiment of the present invention. The removal of the exposed portions of the first insulator layer 114 exposes a portion of the second semiconductor layer 112, which will be used to seed an epitaxial growth of the second semiconductor layer 112 in the second crystal orientation. Remaining portions of the second mask 510 may be removed after etching the first insulator layer 114.

A selective epitaxial growth is then performed, growing the epitaxial layer 710 as illustrated in FIG. 7. Due to the epitaxial growth, the epitaxial layer 710 has the same crystal orientation as the second semiconductor layer 112. The STIs 210 ensure that the epitaxial growth is from the second semiconductor layer 112, rather than the first semiconductor layer 110.

Figure 8:
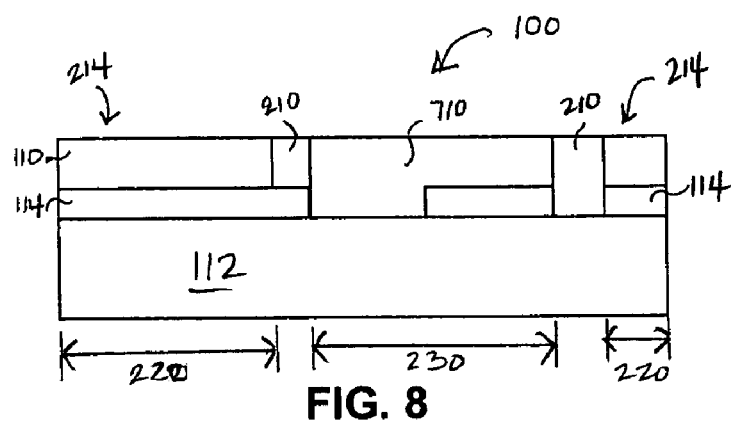

FIG. 8 illustrates the wafer 100 of FIG. 7 after a planarization process has been performed in accordance with an embodiment of the present invention. In an embodiment, a chemical mechanical polishing (CMP) process is used with an oxide slurry wherein the first semiconductor layer 110 acts as a stop layer.

Figure 9:
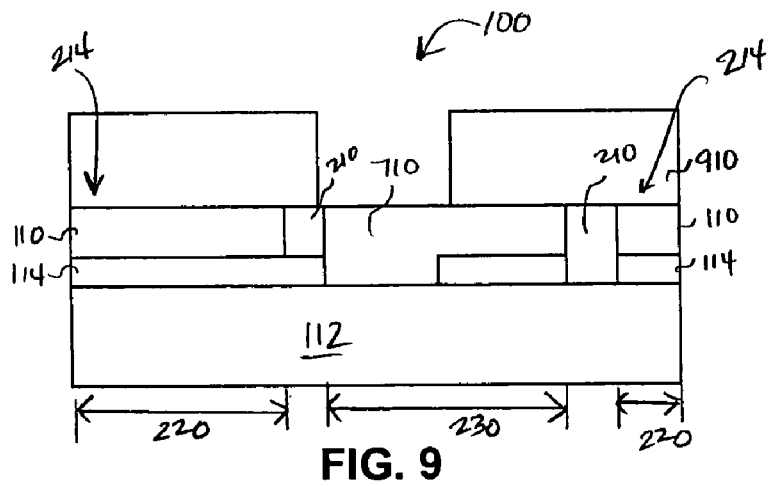

FIG. 9 illustrates the wafer 100 of FIG. 8 after a third mask 910 has been applied and patterned in accordance with an embodiment of the present invention. In an embodiment, one or more layers of hard mask material are formed on the surface of the wafer 100. Any suitable materials and processes may be used.

Thereafter, the hard mask material may be patterned using photolithography techniques known in the art to achieve the third mask 910 as illustrated in FIG. 9. It should be noted that the opening formed in the third mask 910 is preferably slightly larger than the opening connecting the epitaxial layer 710 to the second semiconductor layer 112. Thus, as illustrated in FIG. 9, the opening formed in the third mask 910 vertically overlaps the STI 210 and the edge of the opening formed in the first insulator layer 114.

Figure 10:
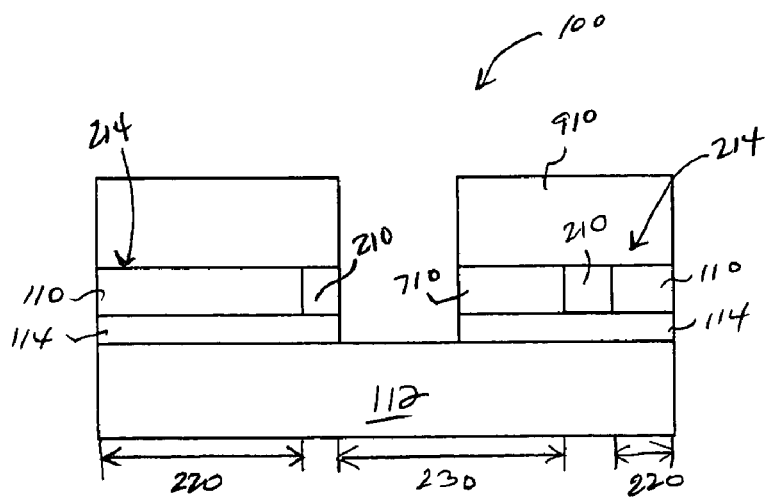

FIG. 10 illustrates the wafer 100 of FIG. 9 after exposed portions of the epitaxial layer 710 have been removed in accordance with an embodiment of the present invention. The exposed portions of the epitaxial layer 710 may be removed by a wet or dry etching process. It should be noted that portions of the STI 210 and the first insulator layer 114 may be removed in the etching process. Furthermore, a portion of the underlying second semiconductor layer 112 may be removed as well during the etching process as illustrated in FIG. 10.

Figure 11:
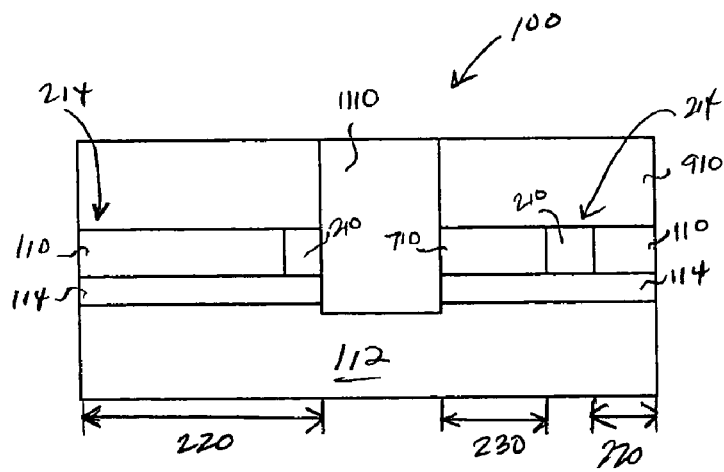

FIG. 11 illustrates the wafer 100 of FIG. 10 after forming an isolation region 1110 in accordance with an embodiment of the present invention. The isolation region 1110 acts to isolate a second active region 1112 formed from the remaining portions of the epitaxial layer 710. It should be noted that the isolation region 1110 isolates the second active region 1112 from the first active region 214 as well as isolates the second active region 1112 from the second semiconductor layer 112. In this manner, the first insulator layer 114 acts as an insulator layer (e.g., a buried oxide (BOX) layer) beneath the first active region 214 and the second active region 1112. The isolation region 1110 may be formed of a dielectric material, such as silicon dioxide, an HDP oxide, or the like.

Figure 12:
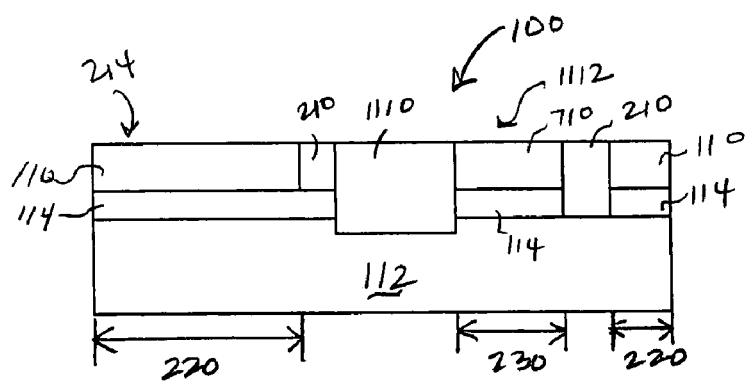

FIG. 12 illustrates the wafer 100 of FIG. 11 after a planarization process has been performed in accordance with an embodiment of the present invention. The planarization process may be, for example, a CMP process using an oxide slurry wherein the first active region 214 and the second active region 1112 act as an etch stop. Thereafter, semiconductor devices, such as transistors, capacitors, resistors, diodes, and the like, may be formed on the wafer 100.

Figure 13:
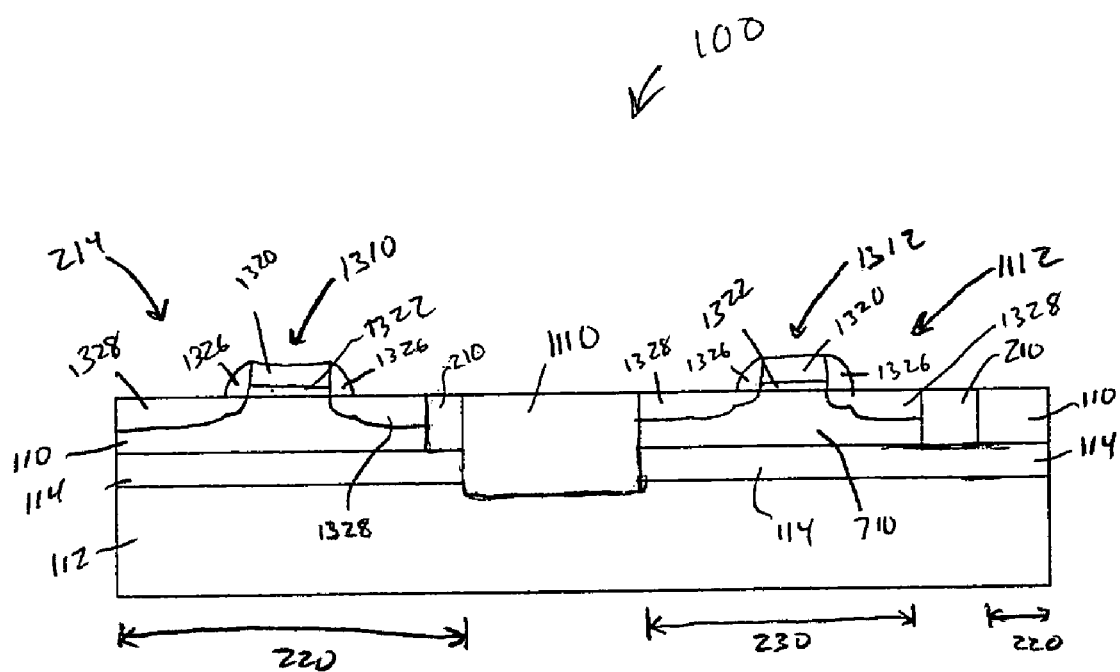
FIG. 13 illustrates a cross-sectional view of an NMOS transistor and a PMOS transistor formed on a wafer having a first crystal orientation and a second crystal orientation in accordance with an embodiment of the present invention.

FIG. 13 illustrates the formation of an exemplary NMOS transistor 1310 in the first active region 214 and an exemplary PMOS transistor 1312 in the second active region 1112. In the preferred embodiment, gate electrodes, each having a gate dielectric layer 1322 and a conductive layer 1320, are formed on the first semiconductor layer 110 in the first active region 214 and on the epitaxial layer 710 in the second active region 1112. Spacers 1326 may be formed and source/drain regions 1328 may be formed by one or more implants.

In this embodiment, it is preferred that the first active region 214 have a crystal orientation of (100) to enhance the electron mobility of the NMOS transistor 1310 and the second active region 1112 have a crystal orientation of (110) to enhance the hole mobility of the PMOS transistor 1312.

One of ordinary skill in the art will appreciate that embodiments of the present invention provides a substrate having a hybrid crystal orientation upon which NMOS and PMOS devices having improved performance may be formed. For example, a wafer may be formed having a first region having a first crystal orientation of (100), which is preferred for NMOS devices. On the same wafer, a second region having a second crystal orientation of (110), which is suitable for PMOS devices, may be formed. In this manner, a wafer may be formed that provides the optimal crystal orientation for both NMOS and PMOS devices, allowing semiconductor devices to be formed that includes both NMOS and PMOS devices without sacrificing operating characteristics of one or the other.

Additionally, embodiments of the present invention provide active regions having differing crystal orientations wherein each active region has an underlying insulator layer, e.g., a BOX layer. The underlying insulator layer may further isolate devices formed in the overlying active regions, thereby preventing or reducing the interaction between those devices.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a first semiconductor layer having a first crystal orientation;
    a second semiconductor layer having a second crystal orientation, the second crystal orientation being different from the first crystal orientation;
    a first insulator layer underlying substantially all of the first semiconductor layer;
    a second insulator layer underlying substantially all of the second semiconductor layer, the first insulator layer and the second insulator layer having substantially equivalent thicknesses and being different portions of a single layer;
    a first isolation structure between the first semiconductor layer and the second semiconductor layer, the first isolation structure being directly over the first insulator layer; and
    a second isolation structure between the first semiconductor layer and the second semiconductor layer, the second isolation structure being adjacent to the first isolation structure, top surfaces of the first isolation structure and the second isolation structure being coplanar, and a bottom surface of the second isolation structure extending farther from the top surfaces than a bottom surface of the first isolation structure, the first isolation structure directly contacting a top surface of the first insulator layer.

2. The semiconductor structure of claim 1, further comprising a third semiconductor layer underlying the first insulator layer and the second insulator layer, the third semiconductor layer having a crystal orientation the same as one of the first semiconductor layer and the second semiconductor layer.

3. The semiconductor structure of claim 1, wherein one of the first semiconductor layer and the second semiconductor layer has a crystal orientation of (100).

4. The semiconductor structure of claim 1, wherein one of the first semiconductor layer and the second semiconductor layer has a crystal orientation of (110).

5. The semiconductor structure of claim 1, wherein the first insulator layer and the second insulator layer comprise an oxide.

6. The semiconductor structure of claim 1, wherein a surface of the first and second semiconductor layers is substantially planar.

7. A semiconductor structure comprising:
a first semiconductor layer having a first crystal orientation;
a first insulator layer on the first semiconductor layer;
a second semiconductor layer on the first insulator layer, the second semiconductor layer having the first crystal orientation;
a third semiconductor layer on the first insulator layer, the third semiconductor layer having a second crystal orientation, the first crystal orientation and the second crystal orientation being different; and
one or more isolation structures isolating the first semiconductor layer, the second semiconductor layer, and the third semiconductor layer from each other, at least one isolation structure having a first layer extending only through the third semiconductor layer to the first insulator layer and a second layer extending through the second semiconductor layer and the first insulator layer to the first semiconductor layer, the first layer directly contacting the first insulator layer.

8. The semiconductor structure of claim 7, wherein one of the second semiconductor layer and the third semiconductor layer has a crystal orientation of (100).

9. The semiconductor structure of claim 7, wherein one of the second semiconductor layer and the third semiconductor layer has a crystal orientation of (110).

10. The semiconductor structure of claim 7, wherein the first insulator layer comprises an oxide.

11. The semiconductor structure of claim 7, wherein the one or more isolation structures comprise an oxide.

12. The semiconductor structure of claim 7, wherein a surface of the second and third semiconductor layers is substantially planar.

13. A semiconductor structure comprising:
a first active region having a first crystal orientation;
a second active region having a second crystal orientation, the second crystal orientation and the first crystal orientation being different;
a first insulating region of a first insulation layer below the first active region;
a second insulating region of the first insulation layer below the second active region;
a semiconductor layer below the first insulation layer, the first insulating region and the second insulating region having substantially co-planar surfaces abutting the semiconductor layer, the semiconductor layer being isolated from the first active region and the second active region; and
an isolation structure between the first active region and the second active region, the isolation structure having a first layer that extends further down than a second layer, the first layer and the second layer having co-planar top surfaces, the second layer directly contacting the first insulation layer.

14. The semiconductor structure of claim 13, wherein one of the first crystal orientation and the second crystal orientation is a crystal orientation of (100).

15. The semiconductor structure of claim 13, wherein one of the first crystal orientation and the second crystal orientation is a crystal orientation of (110).

16. The semiconductor structure of claim 13, wherein the first insulation layer comprises an oxide.

17. The semiconductor structure of claim 13, wherein the semiconductor layer is isolated from the first active region and the second active region by an oxide isolation structure.

18. The semiconductor structure of claim 13, wherein a surface of the first and second active regions is substantially planar.

* * * * *